United States Patent
Clavette et al.

(10) Patent No.: US 12,243,673 B2
(45) Date of Patent: Mar. 4, 2025

(54) COUPLED INDUCTOR PATHS WITH ENHANCED THERMAL DISSIPATION

(71) Applicant: Infineon Technologies Austria AG, Villach (AT)

(72) Inventors: Danny Clavette, Greene, RI (US); Wenkang Huang, East Greenwich, CT (US)

(73) Assignee: Infineon Technologies Austria AG, Villach (AT)

( * ) Notice: Subject to any disclaimer, the term of this patent is extended or adjusted under 35 U.S.C. 154(b) by 300 days.

(21) Appl. No.: 17/846,925

(22) Filed: Jun. 22, 2022

(65) Prior Publication Data

US 2023/0420173 A1    Dec. 28, 2023

(51) Int. Cl.
| | |
|---|---|
| *H05K 1/18* | (2006.01) |
| *H01F 27/06* | (2006.01) |
| *H01F 27/22* | (2006.01) |
| *H01F 27/24* | (2006.01) |
| *H01F 41/02* | (2006.01) |

(52) U.S. Cl.
CPC ............. *H01F 27/22* (2013.01); *H01F 27/06* (2013.01); *H01F 27/24* (2013.01); *H01F 41/0206* (2013.01); *H05K 1/181* (2013.01); *H01F 2027/065* (2013.01); *H05K 2201/1003* (2013.01)

(58) Field of Classification Search
CPC .......... H01F 27/22; H01F 27/06; H01F 27/24; H01F 41/0206; H05K 1/181

USPC ......................................................... 361/782
See application file for complete search history.

(56) References Cited

U.S. PATENT DOCUMENTS

| | | | |
|---|---|---|---|
| 2009/0175014 A1* | 7/2009 | Zeng ....................... | H05K 1/145 361/782 |
| 2014/0118965 A1* | 5/2014 | Ikriannikov ........ | H01F 27/2847 361/748 |
| 2017/0178784 A1* | 6/2017 | Janis ....................... | H01F 27/28 |
| 2017/0178794 A1* | 6/2017 | Yan ......................... | H01F 41/02 |
| 2019/0214181 A1 | 7/2019 | Wang et al. | |
| 2020/0219647 A1 | 7/2020 | Ji et al. | |
| 2022/0285073 A1* | 9/2022 | Yan ......................... | H01F 38/023 |

OTHER PUBLICATIONS

Extended European Search Report, EP 23 18 0368, Nov. 27, 2023, pp. 1-10.

* cited by examiner

*Primary Examiner* — Binh B Tran
(74) *Attorney, Agent, or Firm* — Armis IP Law, LLC

(57) ABSTRACT

An inductor device includes a first face, a first inductive path, and magnetic permeable material. The first face couples the inductor device to a circuit board. The first inductive path extends between a first terminal on the first face to a second terminal on the first face. A portion of the first inductive path is exposed on a second face of the inductor device. The second face is disposed opposite the first face. The second face supports dissipation of heat conveyed by the first inductive path from the first face to the second face. The magnetic permeable material is disposed between the first face and the second face and carries magnetic flux associated with the first inductive path.

29 Claims, 10 Drawing Sheets

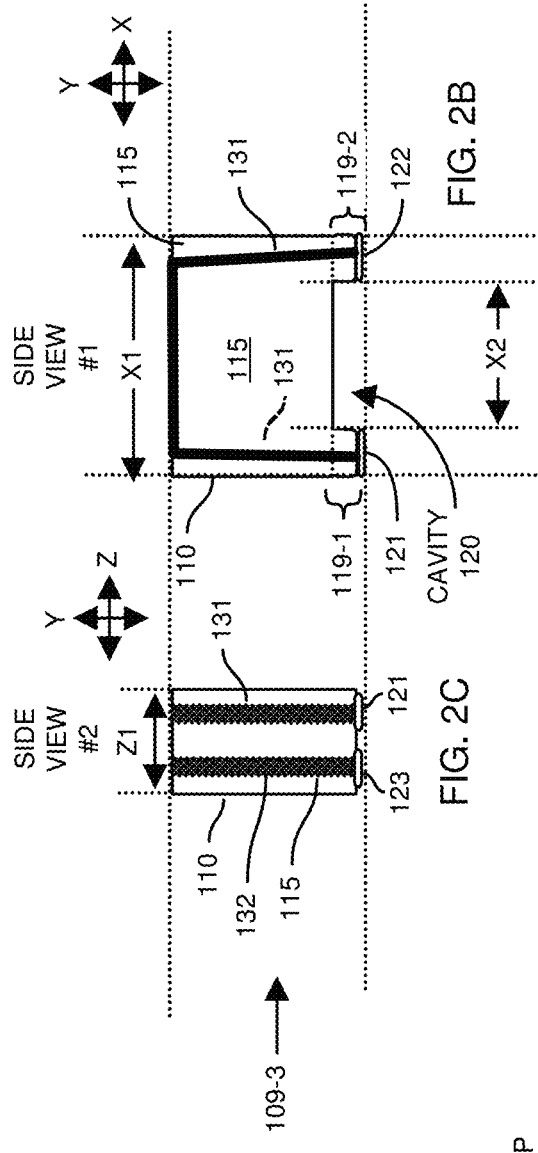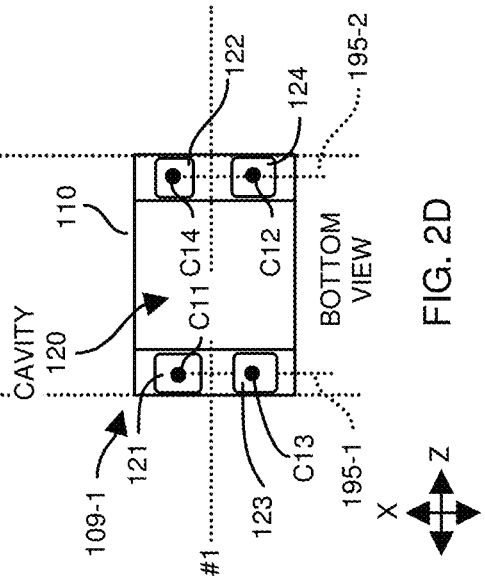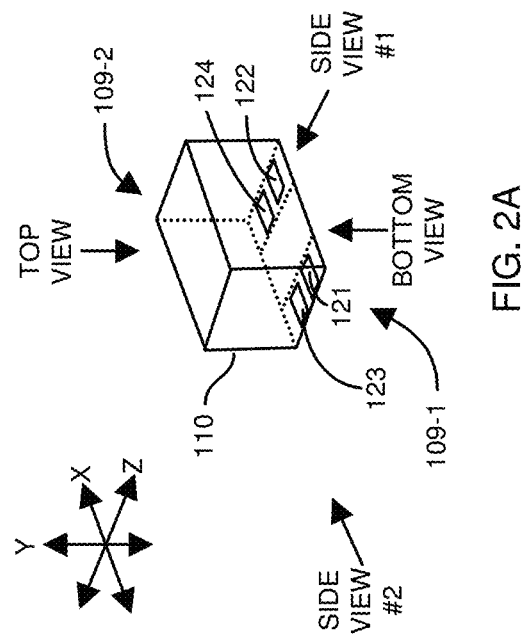

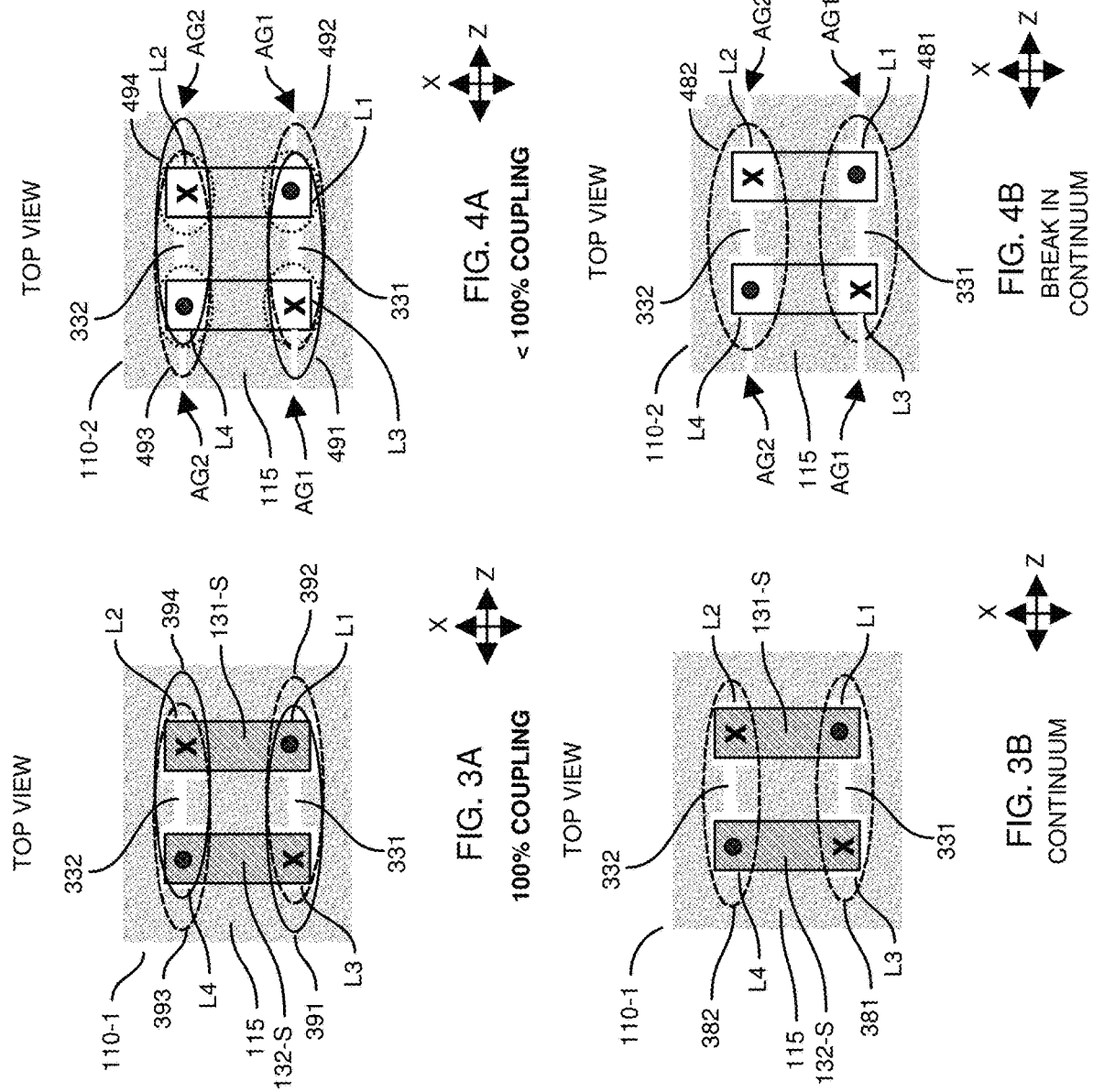

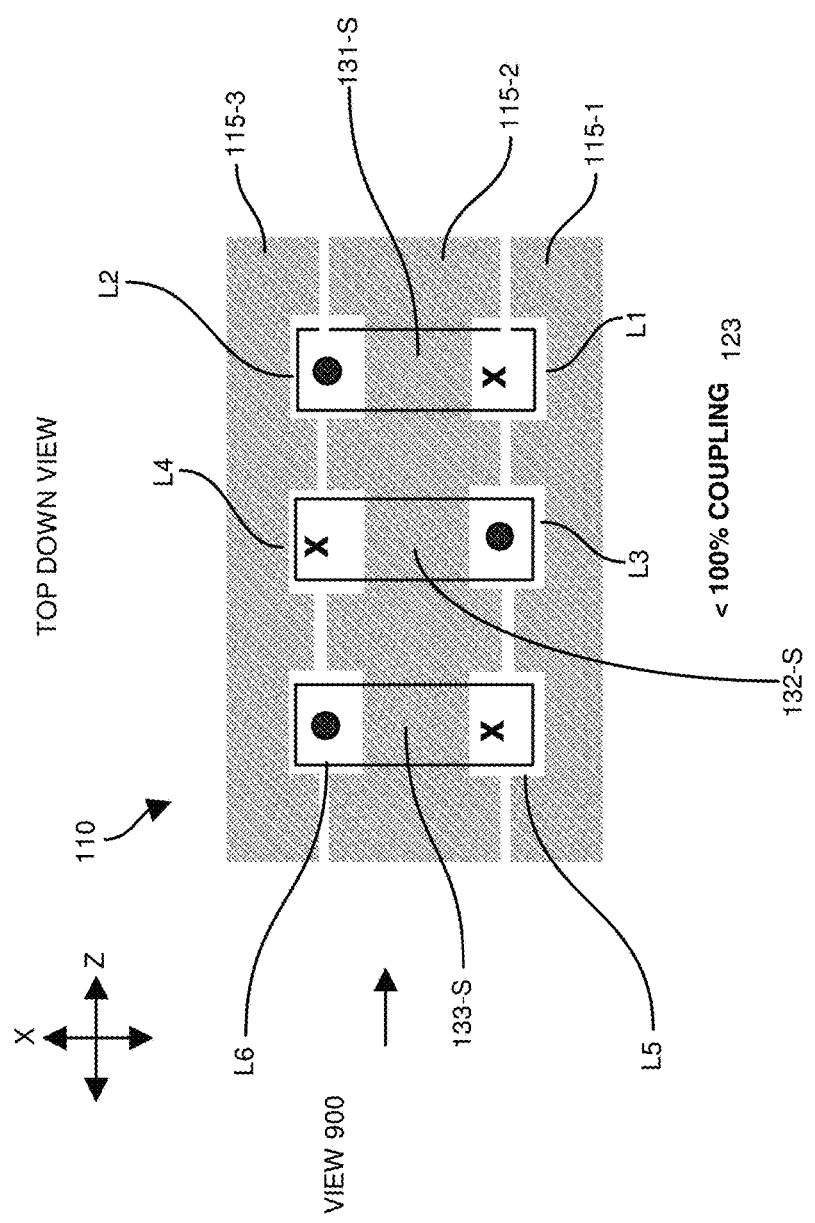
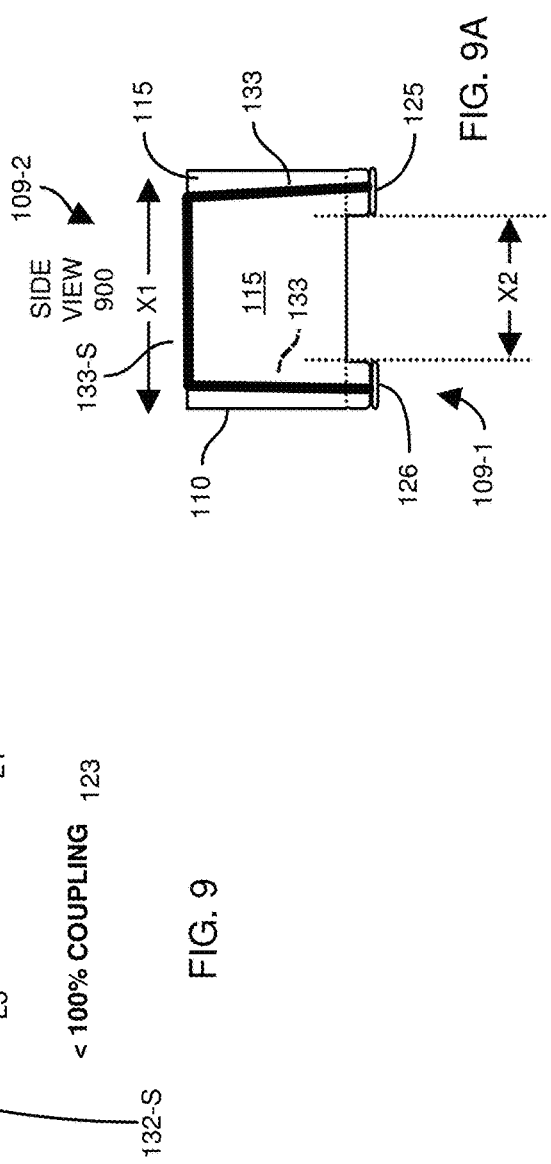
FIG. 9
FIG. 9A

COUPLED INDUCTOR PATHS WITH ENHANCED THERMAL DISSIPATION

BACKGROUND

Conventional switching power supply circuits sometimes include an energy storage component such as an inductor or transformer to produce an output voltage that powers a load. For example, to maintain a magnitude of an output voltage within a desired range, a controller controls switching of current through one or more inductors to produce an output voltage that powers a load.

In general, a conventional inductor is a component comprising of a wire or other conductive material, which is shaped as a coil or helix to increase an amount of magnetic flux through a respective circuit path. Winding a wire into a coil of multiple turns is useful because it increases the number of respective magnetic flux lines in a respective inductor component, increasing the magnetic field and thus overall inductance of the respective inductor component.

The combination of multiple magnetically coupled windings is called a transformer. In general, as is known in the art, the flow of current through a primary winding of a transformer causes a flow of current in a secondary winding of the transformer. As previously discussed, proper control of current through an inductor and/or transformer produces a respective output voltage.

BRIEF DESCRIPTION

Implementation of clean energy (or green technology) is very important to reduce our impact as humans on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator. Regardless of whether energy is received from green energy sources or non-green energy sources, it is desirable to make most efficient use of raw energy (such as storage and subsequent distribution) provided by such systems to reduce our impact on the environment. This disclosure contributes to reducing our carbon footprint and better use of energy via more efficient energy conversion.

This disclosure further includes the observation that conventional inductor components are suited for planar circuit applications in which a respective planar surface of a power supply circuit board is populated with multiple different components that are, in turn, coupled to each other via circuit traces disposed on the planar surface. Such topologies (providing horizontal power flow such as heat dissipation in the power supply circuit board) inevitably make it difficult to create a compact, efficient, and high current output power supply circuit. Such topologies also result in undesirable vertical heat flow. Thus, conventional power supply circuits implementing one or more inductors via windings are undesirable.

In contrast to conventional techniques, this disclosure includes novel and improved inductor components, inductor assemblies, circuit assemblies, etc., providing better heat dissipation.

More specifically, an inductor device (such as a surface mount component) as discussed herein may include a first face, an inductive path, and magnetic permeable material. The first face is operative to couple the inductor device to a circuit board. The first inductive path may extend between a first terminal on the first face to a second terminal on the first face. A portion of the first inductive path may be exposed on a second face of the inductor device. The second face may be disposed opposite the first face. The second face supports dissipation of heat conveyed by the first inductive path from the first face to the second face. The magnetic permeable material may be disposed between the first face and the second face and carries magnetic flux associated with the first inductive path.

The first terminal and the second terminal on the first face may be surface mount pads operative to affix the inductor device to the circuit board.

The second inductive path may extend from a third terminal on the first face to a fourth terminal disposed on the first face; a portion of the second inductive path may be exposed along the second face of the inductor device. The second face may provide dissipation of heat conveyed by the second inductive path from the first face to the second face of the inductor device. The magnetic permeable material is operative to provide magnetic coupling between the first inductive path and the second inductive path.

The inductor device as discussed herein may be disposed on a circuit board. The circuit board may include circuitry such as a first power converter phase disposed on the circuit board and a second power converter phase disposed on the circuit board. The first power converter may be configured to control first current through the first inductive path device to produce an output voltage to power a load. The second power converter phase may be disposed on the circuit board in parallel with the first power converter. The second power converter is operative to control second current through the second inductive path device to produce the output voltage to power the load.

Optionally, the magnetic permeable material may be absent above the second face.

Each of the inductive paths may be implemented in any suitable shape. For example, a portion of the first inductive path may be substantially U-shaped; a portion of the second inductive path may be substantially U-shaped.

The first inductive path and the second inductive path may be disposed in parallel or not in parallel.

As previously discussed, a portion (i.e., first portion) of the first inductive path (such as fabricated from metal) may be exposed on the second face of the inductor device. The first inductive path may further include a second portion and a third portion. The second portion may extend between the first terminal and a first axial end of the first portion; the second portion is operative to convey heat from the first face to the second face. The third portion of the first inductive path is disposed between the second terminal and a second axial end of the first portion. The third portion of the first inductive path is operative to convey heat from the first face to the second face.

The inductor device may further include a second inductive path (such as fabricated from metal) disposed in parallel with the first inductive path. The second inductive path may be configured to extend from a third terminal on the first face of the inductor device to a fourth terminal on the first face of the inductor device. A first portion of the second inductive path may be exposed on the second face of the inductor device.

The inductor device may further include a first void and a second void. The first void may be disposed in the magnetic permeable material as well as may be disposed between a second portion of the first inductive path and a second portion of the second inductive path. The second void in the magnetic permeable material may be disposed between the third portion of the first inductive path and the third portion of the second inductive path.

The inductor device may further include a first continuum of magnetic permeable material to contain first magnetic flux generated by current through the first inductive path. The first continuum of magnetic permeable material may be configured to surround a combination of: i) the second portion of the first inductive path, ii) the second portion of the second inductive path, and iii) the first void. The inductor device may further include a second continuum of magnetic permeable material to contain second magnetic flux. The second continuum of magnetic permeable material may be configured to surround a combination of: i) the third portion of the first inductive path, ii) the third portion of the second inductive path, and iii) the second void.

As previously discussed, the inductor device may be configured to include a second inductive path in parallel with the first inductive path. The second inductive path may be configured to extend from a third terminal on the first face to a fourth terminal on the first face. A portion of the second inductive path may be exposed on the second face of the inductor device. The inductor device may include one or more first voids in the magnetic permeable material preventing formation of a first continuum of magnetic permeable material surrounding a combination of: i) the second portion of the first inductive path, and ii) the second portion of the second inductive path. The inductor device may include one or more second voids in the magnetic permeable material preventing formation of a second continuum of magnetic permeable material surrounding a combination of: i) the second portion of the first inductive path, and ii) the second portion of the second inductive path.

The inductor device may include a heat sink directly coupled to the portion of the inductive path exposed on the second face.

This disclosure further includes a circuit assembly. The circuit assembly can be configured to include power supply circuitry and the inductor device as discussed herein. The inductor device may include a cavity disposed between the first terminal and the second terminal, the power supply circuitry coupled to the circuit board and residing in the cavity.

The circuit assembly may include electronic circuitry and the inductor device described herein. The electronic circuitry may be affixed to the circuit board. The first terminal of the inductor device may be directly connected to a first contact element, the first contact element disposed on the electronic circuitry. The second terminal of the inductor device may be directly connected to a second contact element. The second contact element may be disposed on the circuit board.

Yet further, a width of a first portion of the first inductive path exposed on the second face of the inductor device may be greater than a width of a second portion of the first inductive path extending from the first face to the second face.

This disclosure further includes one or more methods. For example, the method may include: fabricating a first inductive path of an inductor device to include a first face operative to couple the inductor device to a circuit board; fabricating the first inductive path to extend between a first terminal to a second terminal on the first face, a portion of the first inductive path exposed on a second face of the inductor device, the second face disposed opposite the first face and operative to provide dissipation of heat conveyed by the first inductive path from the first face to the second face; and fabricating the first inductive path to include magnetic permeable material disposed between the first face and the second face.

This disclosure further includes an inductor device including a first face, a first conductive path, a second conductive path, and at least one void. The first face is operative to couple the inductor device to a circuit board. The first inductive path extends between a first terminal on the first face to a second terminal on the first face; the second inductive path extends between a third terminal on the first face to a fourth terminal on the first face. The second inductive path may be magnetically coupled to the first inductive path via magnetic permeable material disposed between the first face and the second face. The at least one void is disposed in the magnetic permeable material between the first inductive path and the second inductive path.

The at least one void may include a first void and the second void. The first void in the magnetic permeable material may be disposed between a first portion of the first inductive path and a first portion of the second inductive path; the second void in the magnetic permeable material may be disposed between a second portion of the first inductive path and a second portion of the second inductive path.

Each of the at least one void in the magnetic permeable material may include one or more first voids in the magnetic permeable material interrupting a continuum of magnetic permeable material surrounding a combination of: i) the first inductive path, and ii) the second inductive path. The presence of the voids reduces inductive coupling. Accordingly, via the voids, it is possible to control an amount of magnetic coupling between the first inductive path and the second inductive path.

The inductor device may further include a third inductive path disposed adjacent the second inductive path. The third inductive path extends from a fifth terminal disposed on the first face to a sixth terminal disposed on the first face. A portion of the third inductive path is exposed along the second face of the inductor device. The second face provides dissipation of heat conveyed by the third inductive path from the first face to the second face of the inductor device.

These and other more specific examples are disclosed in more detail below.

Note that any of the resources (such as a fabricator) implemented in the system as discussed herein can include one or more computerized devices, controllers, mobile communication devices, handheld or laptop computers, or the like to carry out and/or support any or all of the method operations disclosed herein. In other words, one or more computerized devices or processors can be programmed and/or configured to operate as explained herein to carry out the different implementations as described herein.

Yet other implementations herein include software programs to perform the steps and operations summarized above and disclosed in detail below. One such implementation comprises a computer program product including a non-transitory computer-readable storage medium (i.e., any computer readable hardware storage medium) on which software instructions are encoded for subsequent execution.

The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, implementations herein are directed to a method, system, computer program product, etc., that supports operations as discussed herein.

One example in this disclosure includes a fabricator such as including computer readable storage medium and/or system having instructions stored thereon to fabricate an inductor device. The instructions, when executed by computer processor hardware, cause the computer processor hardware (such as one or more co-located or disparately located processor devices or hardware) to: fabricate a first inductive path of an inductor device to include a first face operative to couple the inductor device to a circuit board; fabricate the first inductive path to extend between a first terminal to a second terminal on the first face, a portion of the first inductive path exposed on a second face of the inductor device, the second face disposed opposite the first face and operative to provide dissipation of heat conveyed by the first inductive path from the first face to the second face; and fabricate the first inductive path to include magnetic permeable material disposed between the first face and the second face.

The ordering of the steps above has been added for clarity sake. Note that any of the processing steps as discussed herein can be performed in any suitable order.

Other examples of the present disclosure include software programs and/or respective hardware to perform any of the method operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although implementations as discussed herein are applicable to switching power supplies, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of implementations herein (BRIEF DESCRIPTION) purposefully does not specify every implementation and/or incrementally novel aspect of the present disclosure or claimed invention(s). Instead, this brief description only presents general implementations and corresponding points of novelty over conventional techniques. For additional details and/or possible perspectives (permutations) of the invention(s), the reader is directed to the Detailed Description section (which is a summary of implementations) and corresponding figures of the present disclosure as further discussed below.

BRIEF DESCRIPTION OF THE DRAWINGS

FIG. 2A is an example diagram illustrating a three-dimensional (see-through) view of an outer structure associated with an inductor device as discussed herein.

FIG. 2B is an example first side view diagram of internal components of the inductor device in FIG. 2A as discussed herein.

FIG. 2C is an example second side view diagram of internal components of the inductor device in FIG. 2A as discussed herein.

FIG. 2D is an example bottom view diagram associated with the inductor device in FIG. 2A.

FIG. 3A is an example diagram illustrating instances of magnetic flux coupling provided by a first implementation of the inductor device as discussed herein.

FIG. 3B is an example diagram illustrating a continuum of magnetic permeable material in an inductor device supporting the magnetic flux coupling as discussed herein.

FIG. 4A is an example diagram illustrating instances of magnetic flux coupling provided by a first implementation of the inductor device as discussed herein.

FIG. 4B is an example diagram illustrating a break in a continuum of magnetic permeable material in an inductor device supporting the magnetic flux coupling as discussed herein.

FIG. 9 is an example diagram illustrating extension to three or more inductive paths from the inductor device as discussed herein.

Figure 1:
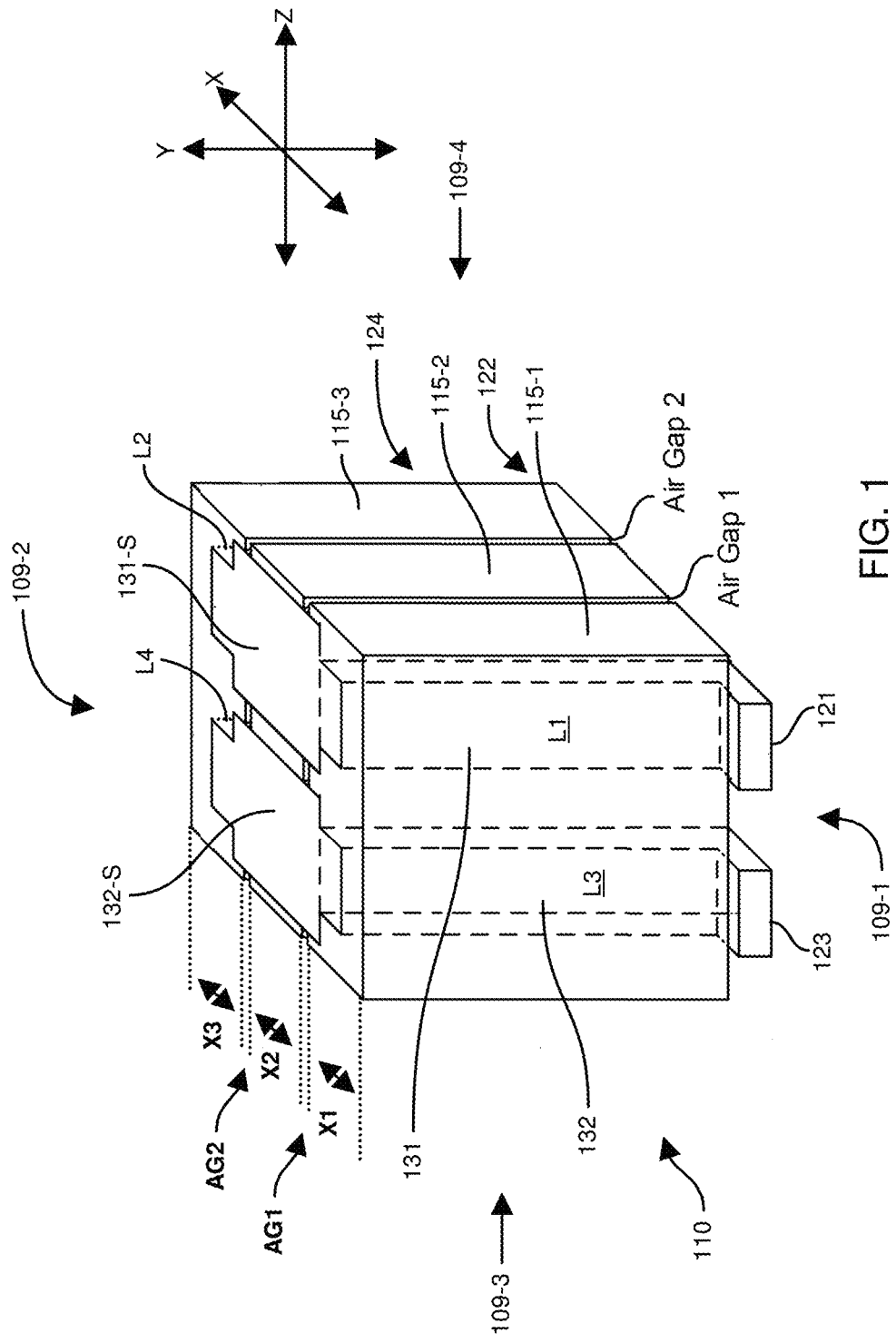
FIG. 1 is an example diagram illustrating a three-dimensional view of a structure associated with an inductor device including multiple inductive paths and implementing topside cooling as discussed herein.

The foregoing and other objects, features, and advantages of implementations herein will be apparent from the following more particular description herein, as illustrated in the accompanying drawings in which like reference characters refer to the same parts throughout the different views. The drawings are not necessarily to scale, with emphasis instead being placed upon illustrating the implementations, principles, concepts, etc.

DETAILED DESCRIPTION

Now, with reference to the drawings, FIG. 1 is an example diagram illustrating a three-dimensional (see-through) view of an inductor device including multiple inductive paths as discussed herein.

As shown in FIG. 1, the inductor device 110 includes multiple terminals 121, 122, 123, and 124 (such as surface pads, pins, connectors, etc.). A view of the terminals 122 and 124 is shown in FIGS. 2A-2D.

Referring again to FIG. 1, as further discussed herein, the multiple terminals 121, 122, 123, and 124 provide connectivity of the inductor device 110 (such as transformer) to a respective substrate and/or assembly.

The inductor device 110 can be configured as any suitable type of device. For example, the inductor device 110 can be configured as a surface mount transformer device (a.k.a., inductor device) uniquely designed to support functions as discussed herein. Each of the first terminal 121, the second terminal 122, the third terminal 123, and the fourth terminal 124, can be configured to include a respective exposed surface area (such as a pad) to connect the terminals of the inductor device 110 to a respective circuit board, substrate, or other object.

Respective surfaces (such as associated with face 109-1) of the first terminal 121, the second terminal 122, the third terminal 123, and the fourth terminal 124 may be configured to reside in a common plane (X-Z plane) of the inductor device 110. Alternatively, respective surfaces (such as associated with face 109-1) of the first terminal 121, the second terminal 122, the third terminal 123, and the fourth terminal 124 may be configured to not reside in a common plane (X-Z plane) of the inductor device 110.

As further shown, the inductor device 110 includes one or more sections of magnetic permeable material 115 such as section X1 of magnetic permeable material, section X2 of magnetic permeable material, and section X3 of magnetic permeable material. Each of the sections is spaced apart via an air gap (a.k.a., void) or material of different magnetic permeable material than magnetic permeable material 115.

More specifically, the section 115-1 of magnetic permeable material 115 is spaced apart with respect to section 115-2 of the magnetic permeable material 115 by airgap AG1 (such as a first void in the magnetic permeable material); the section 115-2 of magnetic permeable material 115 is spaced apart with respect to section 115-3 by airgap AG2 (such as a second void in the magnetic permeable material).

The inductor device 110 includes multiple electrically conductive paths such as inductive path 131 (fabricated from metal or other suitable material) disposed side by side and parallel with respect to inductive path 132. The inductive path 131 (a.k.a., electrically conductive path) extends from first terminal 121 to the second terminal 122. The inductive path 132 (a.k.a., electrically conductive path) extends from first terminal 123 to the second terminal 124.

Each of the first terminal 121, second terminal 122, third terminal 123, and fourth terminal 124 on the first face 109-1 may be surface mount pads to affix the inductor device 110 to a circuit board.

The inductor device 110 further includes face 109-2. The inductive path 131 includes exposed (metal) surface 131-S on top face 109-2; the inductive path 132 includes exposed (metal) surface 132-S on top face 109-2. The surface 131-S and corresponding inductive path 131 is electrically isolated from the surface 132-S and corresponding inductive path 132.

A first portion (a.k.a., leg L1) of the inductive path 131 parallel to the Y-axis and extending between the terminal 121 and a first axial end of the surface 131-S provides high thermal conductivity as well as high electrical conductivity between the face 109-1 and face 109-2. Thus, the first portion (a.k.a., leg L1) of the inductive path 131 may convey heat from the first face 109-1 to the second face 109-2. A second portion (a.k.a., leg L2) of the inductive path 131 parallel to the Y-axis and extending between the terminal 122 and a second axial end of the surface 131-S provides high thermal conductivity as well as high electrical conductivity. Thus, as further discussed herein, the second portion (a.k.a., leg L2) of the inductive path 131 conveys heat from the first face 109-1 to the second face 109-2.

A first portion (a.k.a., leg L3) of the inductive path 132 parallel to the Y-axis and extending between the terminal 123 and a first axial end of the surface 132-S provides high thermal conductivity as well as high electrical conductivity between the face 109-1 (a.k.a., facing) and face 109-2 (a.k.a., facing). Thus, the first portion (a.k.a., leg L3) of the inductive path 132 may convey heat from the first face 109-1 to the second face 109-2. A second portion (a.k.a., leg L4) of the inductive path 132 parallel to the Y-axis and extending between the terminal 124 and a second axial end of the surface 132-S provides high thermal conductivity as well as high electrical conductivity. Thus, as further discussed herein, the second portion (a.k.a., leg L4) of the inductive path 132 conveys heat from the first face 109-1 to the second face 109-2.

Accordingly, as discussed herein, the inductor device 110 includes: i) a first face 109-1 operative to couple the inductor device 110 to a circuit board; i) a first inductive path 131 extending between a first terminal 121 on the first face 109-1 to a second terminal 122 on the first face 109-1. A portion (such as surface 131-S, optionally planar and above which magnetic permeable material is absent) of the first inductive path 131 is exposed on a second face 109-2 of the inductor device. The second face 109-2 is disposed opposite the first face 109-1. As further discussed herein, the second face 109-2 is operative to provide dissipation of heat conveyed by the first inductive path 131 from the first face 109-1 to the second face 109-2. As further discussed herein, the magnetic permeable material 115 disposed between the first face 109-1 and the second face 109-2 carries (or contains) magnetic flux associated with the first inductive path 131.

The inductor device 110 further includes: iv) a second inductive path 132 extending between a third terminal 123 on the first face 109-1 to a fourth terminal 124 on the first face 109-1. A portion (such as surface 132-S) of the second inductive path 132 is exposed on a second face 109-2 of the inductor device 110. The second face 109-2 is disposed opposite the first face 109-1. As further discussed herein, the second face 109-2 is operative to provide dissipation of heat conveyed by the second inductive path 132 from the first face 109-1 to the second face 109-2. The magnetic permeable material 115 disposed between the first face 109-1 and the second face 109-2 carries (or contains) magnetic flux associated with the first inductive path 132.

As previously discussed, the magnetic permeable material 115 of the inductor device 110 provides magnetic coupling between the first inductive path 131 and the second inductive path 132. It is noted that the magnetic permeable material 115 is absent from being above the second face 109-2, corresponding to a region in which there is little or no magnetic coupling between the inductive path 131 and the inductive path 132.

The inductive paths may be any suitable shapes. For example, the first inductive path 131 may be U-shaped; the second inductive path 132 may be U-shaped. The first inductive path 131 and the second inductive path 132 are disposed in parallel.

As previously discussed, it is further noted that the inductive path 131 and the inductive path 132 are not magnetically coupled along a full length of the respective inductive paths. For example, the magnetic permeable material 115 provides magnetic coupling between portions of the inductive paths 131 and 132 that extend by the first surface 109-1 and the second surface 109-2. Because the magnetic permeable material 115 is absent from being above the surface 131-S and the surface 132-S, there is little or no magnetic coupling of the first inductive path 131 to the second inductive path 132 in that portion (i.e., portions of the inductive paths that extend parallel to the X-axis.

Additional views of the inductor device 110 in FIGS. 2A, 2B, 2C, and 2D illustrate the inner components and workings associated with the inductor device 110.

FIG. 2A illustrate placement of terminals on the inductor device 110. For example, as previously discussed, the bottom face 109-1 of the inductor device 110 may include exposed terminals 121, 122, 123, and 124.

FIG. 2B is an example first side view diagram of internal components of the inductor device in FIG. 1.

As shown in FIG. 2B and other views, the inductor device 110 includes multiple electrically conductive paths such as inductive paths 131 and 132. The inductive path 131 (electrically conductive path) extends from the terminal 121 to the terminal 122 (such as surface pads, connectors, etc.) of the inductor device 110. The inductive path 132 (electrically conductive path) extends from the terminal 123 to terminal 124 of the inductor device 110.

Note again that the terminal 121 is electrically isolated from the terminal 123 although it resides next to it. The terminal 122 is electrically isolated from the terminal 124 although it resides next to it.

Presence and proximity of the inductive paths 131 and 132 to each other in or with respect to the magnetic permeable material 115 of the inductor device 110 as shown in the different views transforms the electrically conductive paths into a first inductive path 131 and transforms the second electrically conductive path into a second inductive path 132.

The inductive paths 131 and 132 in the inductor device 110 may be spaced apart via a void, magnetic permeable material 115, etc., so as not to contact each other and can be fabricated using any suitable electrically conductive material. For example, the electrically conductive paths can be fabricated from metal (such as copper, tin, lead, gold, silver, and platinum, aluminum, iron, etc.), a metal alloy (such as a metallic substance made by mixing and fusing two or more metals, or a metal and a nonmetal, etc.).

As previously discussed, the inductor device 110 may further include a core structure at least partially fabricated from or including magnetically permeable material 115 and/or standoffs 119. In such an instance, the spaced apart first electrically conductive path 131 and the second electrically conductive 132 path extend through the magnetic permeable material 115.

As further shown, the inductor device 110 can be fabricated in accordance with any suitable pattern. For example, the first electrically conductive path 131 (primary inductive path) can be configured as a first U-shaped winding (such as a single turn) extending from the terminal 121 to the terminal 122. The second electrically conductive path 132 (such as secondary inductive path) can be configured as a second U-shaped winding (such as a single turn) extending from the terminal 123 to the terminal 124. As previously discussed, one or more portions of the second electrically conductive path 132 are magnetically coupled to respective one or more portions of the first electrically conductive path 131. Thus, the inductor device 110 may be a transformer, where the inductive path 131 is a first winding and the second inductive path 132 is a second winding.

Note further that each of the electrically conductive paths in the inductor device 110 can include multiple turns if desired, the windings being magnetically coupled to each other.

As further shown, the inductor device 110 can be configured to include a cavity 120 disposed in its core structure between terminals and corresponding standoffs. For example, core structure of the inductor device 110 can be configured to include magnetic permeable material 115 and standoffs 119-1 and 119-2. As its name suggests, standoffs 119-1 and 119-2 provide a spacing (such as associated with cavity 120) on a bottom surface of the inductor device 110 with respect to a circuit board to which the inductor device 110 is attached. See further FIGS. as discussed herein. Note that the standoffs can be fabricated from magnetic permeable material 115 or other suitable insulator material such as plastic. Thus, the cavity 120 can be configured as a void disposed on a bottom side of the inductor device 110. The cavity 120 enables airflow as well as provides space (open volume) in which other circuitry can occupy as further discussed herein.

FIG. 2C is an example second side view diagram of an inductor device in FIG. 1 and FIG. 2A.

This side view diagram of the inductor device 110 illustrates connectivity of a first axial end of the inductive path 131 to the terminal 121 and connectivity of a first axial end of the inductive path 132 to the terminal 123. At an opposite end, the inductor device 110 includes connectivity of a second axial end of the inductive path 131 to the terminal 122 and connectivity of a second axial end of the inductive path 132 to the terminal 124.

Further, the side view diagram of FIG. 2C illustrates the width of the inductor device 110 as being Z1, which can be any suitable value.

FIG. 2D is an example bottom view diagram of an inductor device in FIG. 1 and FIG. 2A.

As shown, the inductor device 110 includes a bottom surface as shown via the bottom view of the inductor device 110 in FIG. 2D. The first terminal 121, the second terminal 122, the third terminal 123, and the fourth terminal 124 on the bottom surface of the inductor device 110 can be implemented as metallic pads, pins, etc.

Each of the terminals can be configured in any suitable shape. For example, the first terminal 121 may be a first substantially rectangular surface mount pad; the second terminal 122 may be a second substantially rectangular surface mount pad; the third terminal 123 may be a third substantially rectangular surface mount pad; and the fourth terminal 124 may be a fourth substantially rectangular surface mount pad.

FIG. 3A is an example diagram illustrating magnetic flux coupling provided by a first implementation of the inductor device as discussed herein.

As previously discussed, the volume of space above the top face 109-2 of the instance of inductor device 110-1 may be void of magnetic permeable material 115 in which case there is little or no magnetic coupling between the inductive path 131 and the inductive path 132 in that region.

The instance of inductor device 110-1 can be configured to include a void 331 extending through the magnetic permeable material 115 between the first face 109-1 and the second face 109-2 as well as between leg L1 and leg L3. For example, the void may extend between a first leg L1 of the inductive path 131 and first leg L3 of the inductive path 132 from face 109-1 to face 109-2. As previously discussed, each of the legs L1, L2, L3 and L4 extend parallel to the y-axis.

As shown in FIG. 3B, in such an instance, the inductor device 110-1 includes a first continuum 381 of magnetic permeable material 115 surrounding the first legs (L1 and L3) of the inductive paths 131 and 132 extending between the first face 109-1 and the second face 109-2 to contain first magnetic flux 391 and 392 (FIG. 3A).

Thus, the first continuum 381 of magnetic permeable material 115 in FIG. 3B surrounds a combination of: i) a first portion or leg L1 of the first inductive path 131 along void 331 between the face 190-1 and face 109-2, ii) a first portion or leg L3 of the second inductive path 132 along the void 331 between the first face 109-1 and second face 109-2, and iii) the first void 331 itself.

A second continuum 382 of magnetic permeable material 115 contains second magnetic flux 393 and 394 (FIG. 3A). The second continuum 382 of magnetic permeable material 115 in FIG. 3B surrounds a combination of: i) a portion of leg L2 of the first inductive path 131 along the void 332 between the face 190-1 and face 109-2, ii) a portion or leg L4 of the second inductive path 132 along the void 332 between the first face 109-1 and second face 109-2, and iii) the second void 332 itself.

FIG. 4A is an example diagram illustrating magnetic flux coupling provided by a second implementation of the inductor device as discussed herein.

In this example, the instance of inductor device 110-2 includes one or more void interrupting the continuum in FIG. 3B. For example, in FIG. 4A, the instance of inductor device 110-2 includes: i) a first void 331 in the magnetic permeable material 115, the first void 331 is disposed between a portion (leg L1) of the first inductive path 131 and a portion (leg L3) of the second inductive path 132; and ii) a second void 332 in the magnetic permeable material 115, the second void 332 disposed between the portion (such as leg L2) of the first inductive path and the portion (leg L4) of the second inductive path 132.

Inductor device 110-2 also can be configured to include void as indicated by AG1 and AG2. Thus, the instance of inductor device 110-2 may include one or more first voids (331 and 332) and second voids (AG1 and AG2) in the magnetic permeable material 115. As shown in FIG. 4B, the one or more voids (associated with AG1) result in a first non-continuum 481 of magnetic permeable material 115 and prevent formation of a first continuum of magnetic permeable material 115 surrounding a combination of: i) the portion (leg L1) of the first inductive path 131, and ii) the portion (leg L2) of the second inductive path 132. As further shown in FIG. 4B, the one or more voids (associated with AG2) result in a second non-continuum 482 of magnetic permeable material 115 and prevent formation of a second continuum of magnetic permeable material 115 surrounding a combination of: i) the portion (leg L2) of the first inductive path 131, and ii) the portion (leg L4) of the second inductive path 132. Thus, magnitude coupling associated with the inductor device 110-2 is less than 100 such as around 50% or other suitable value.

Figure 5:
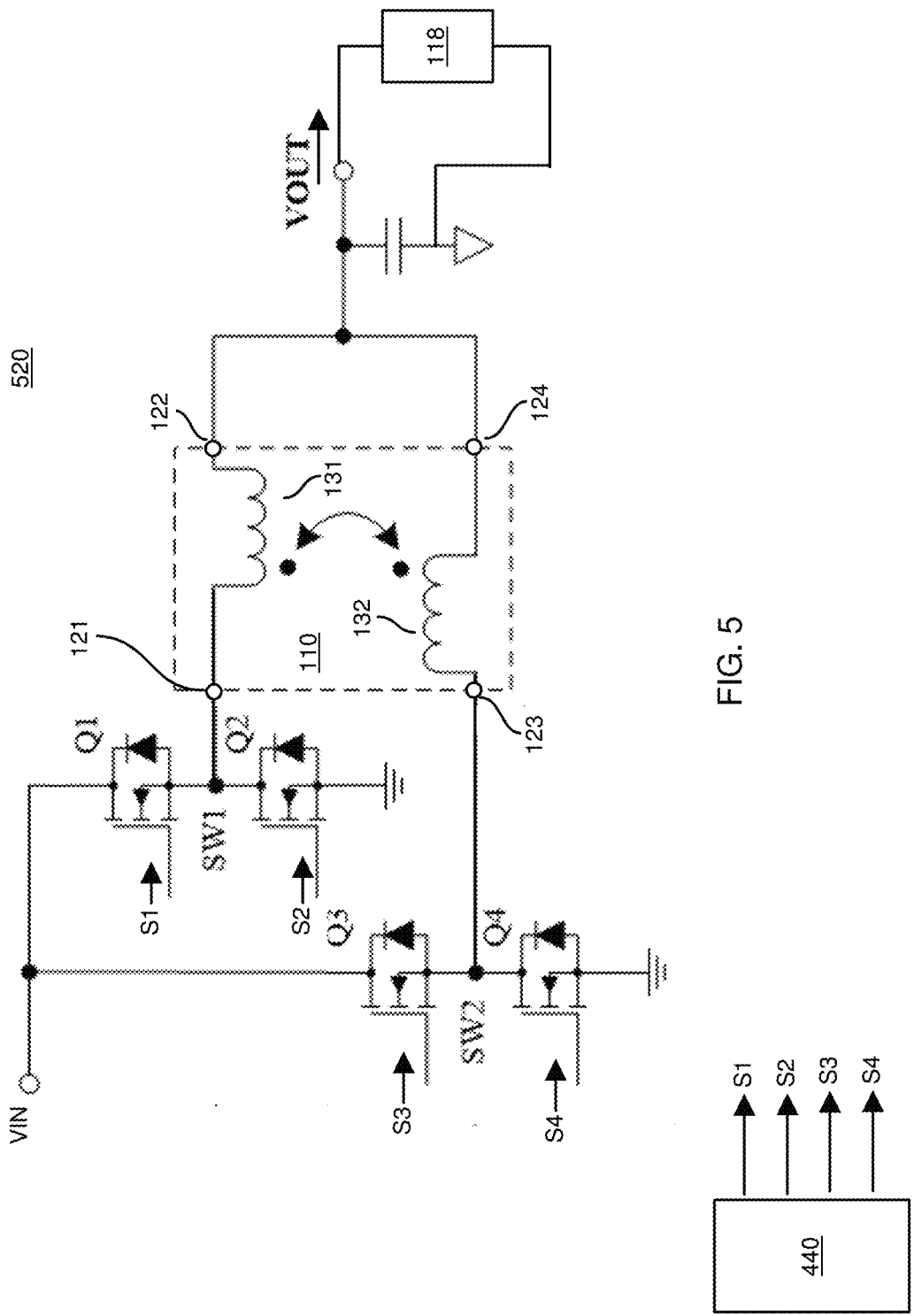
FIG. 5 is an example diagram illustrating a circuit implementing an inductor device as discussed herein.

FIG. 5 is an example diagram illustrating a circuit implementing an inductor device as discussed herein.

As previously discussed, the inductor device 110 may include a cavity 120 (as shown in FIG. 2B) in which to populate a respective circuit such as power converter 520. In this example of FIG. 5, the power converter 520 includes switch Q1, switch Q2, switch Q3, and switch Q4. Switch Q1 and switch Q2 are disposed in series between the input voltage and ground potential. Switch Q3 and switch Q4 are disposed in series between the input voltage Vin and the ground potential. Node SW1 provides coupling between the switch Q1, switch Q2, and the terminal 121 of the inductive path 131. Node SW2 provides coupling between the switch Q3, switch Q4, and the terminal 123 of the inductive path 132.

The power converter 520 includes a first power converter phase (such as switch Q1, switch Q2, inductive path 131) disposed on a circuit board; the controller 440 of the first power converter is operative to control first current through the first inductive path 131 from node SW1 to produce an output voltage VOUT to power a load 118; the power converter 520 includes a second power converter phase (such as switch Q3, switch Q4, inductive path 132) disposed on a circuit board; the controller 440 of the second power converter is operative to control second current through the second inductive path 132 from node SW2 to produce an output voltage VOUT to power a load 118.

During operation, the controller 540 monitors magnitude of the output voltage VOUT used to power the respective load 118. The controller 540 generates the control signals S1, S2, S3, and S4 to control the respective switches in the power converter 520 and a magnitude of current passing through each of the inductive paths 131 and 132 to the dynamic load 118. As shown, the power converter 520 can be configured to include a first buck converter phase and a second buck converter phase disposed in parallel to produce the output voltage VOUT from the input voltage Vin. It should be noted that the inductive path 131 is magnetically coupled to inductive path 123. As previously discussed, the amount of magnetic coupling between the inductive path 131 and the inductive path 132 varies depending upon whether void or air gaps are implemented in the magnetic permeable material 115 of the inductor device 110.

Figure 6:
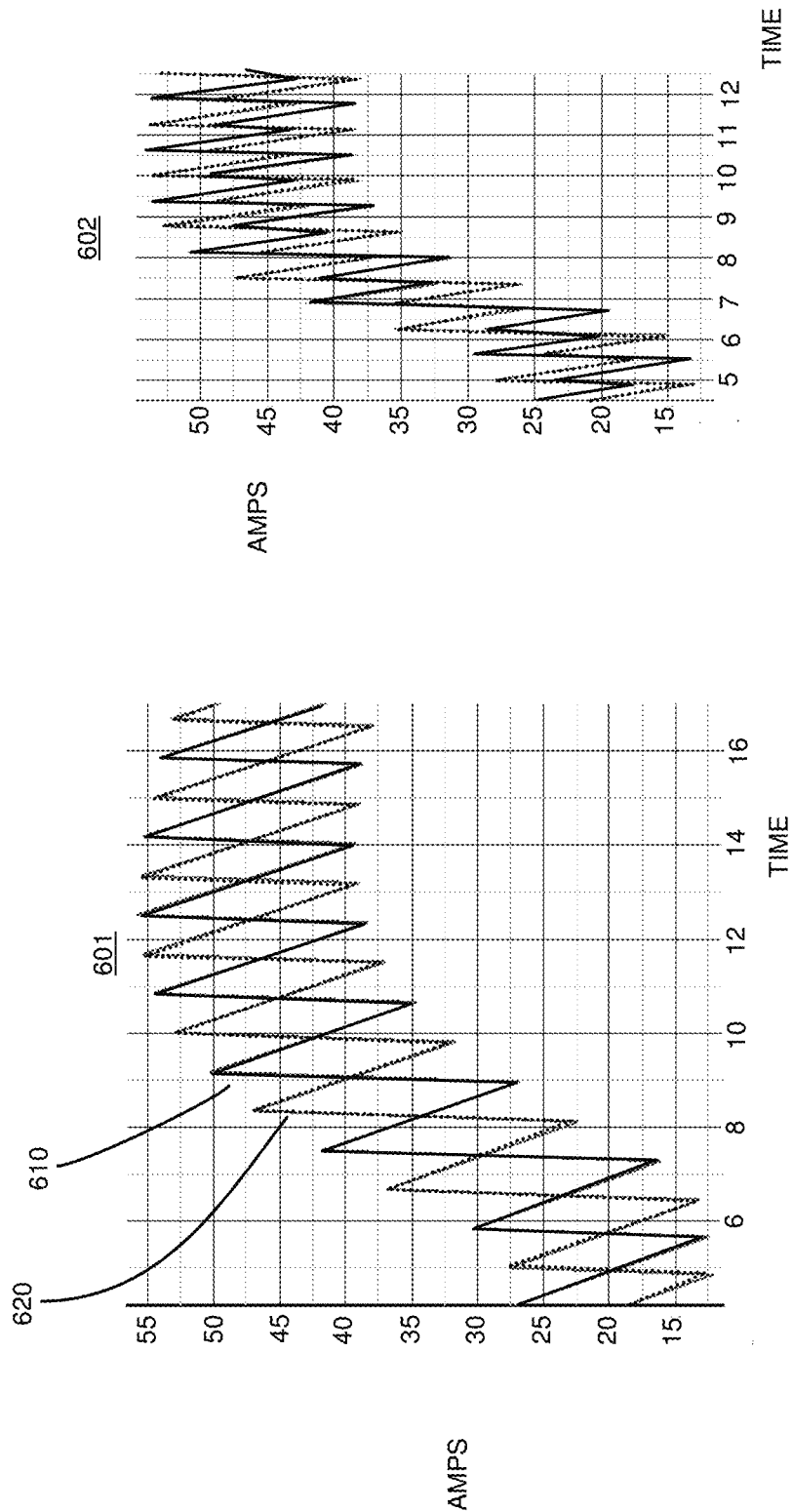
FIG. 6A is an example diagram illustrating inductor ripple currents with no coupling as discussed herein.
FIG. 6B is an example diagram illustrating inductor ripple currents with 50% coupling as discussed herein.

FIG. 6A is an example diagram illustrating inductor ripple currents with no coupling as discussed herein.

Without inverse coupling, only the power supply phase of power converter 520 reacting to a load transient will increase its inductor current (such as through inductive path 131), resulting in slower ramp up of currents under transients as seen in FIG. 6A. The line 610 and line 620 in graph 601 represent respective inductor currents through the inductive paths with a 180 degree phase shift.

FIG. 6B is an example diagram illustrating inductor ripple currents with 50% coupling as discussed herein.

The inverse coupled inductive paths can be used to improve load transients from a phase reacting to a load transient by inducing flux coupling into the neighboring phase to effectively increase the transient current output of a respective inductive path, as seen in graph 602 of FIG. 6B. Note the TIME axis and Ampere axis are to scale with FIG. 6A and the faster inductor current ramp rates under transients. The inductor ripple frequency is also doubled due to coupling.

Figure 7:
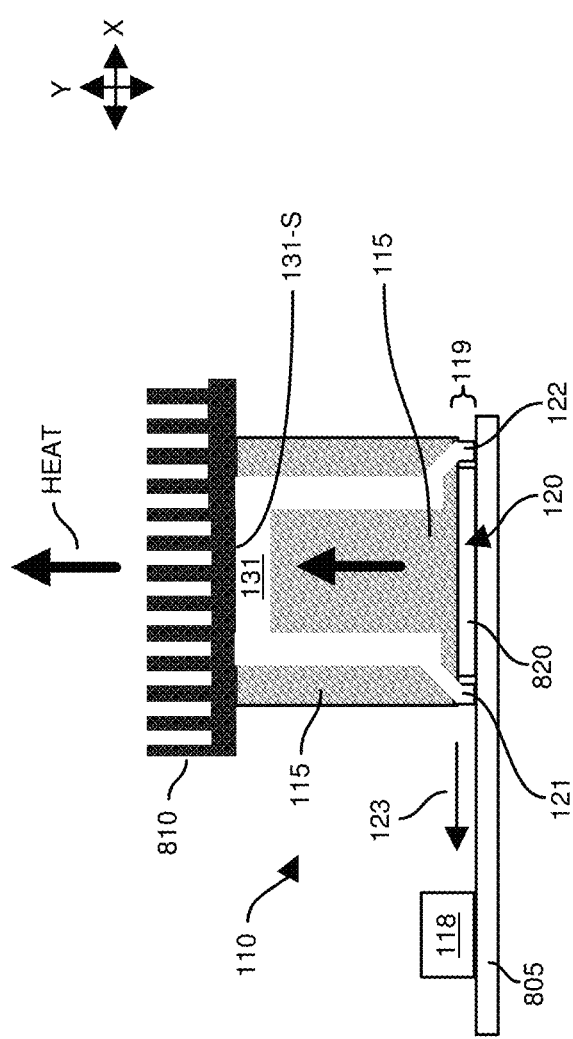
FIG. 7 is an example side view diagram of an inductor device including a heat sink as discussed herein.

FIG. 7 is an example side view diagram of an inductor device including a heat sink as discussed herein.

As previously discussed, each of the inductive paths 131 and 132 provide a flow of heat from the substrate or circuit to the respective exposed surfaces 131-S and 132-S. In this example, the exposed surfaces of the inductive paths 131 and 132 are in contact with a bottom surface of the heat sink 810.

It is further noted that the magnetic permeable material 115 (such as associated with section 115-1, 115-2, 115-3, etc.) provides a further flow of heat (albeit small) from the substrate and/or circuit 820 to the heat sink 810.

The inductive paths and magnetic permeable material can have any suitable thermal conductivity. For example, the material in the inductive paths 131 and 132 may have a thermal conductivity of 400 W/mK (Watts per meter-kelvin). In comparison, the magnetic permeable material 115 may have a thermal conductivity of 5 W/mK. Accordingly, most (such as 95% or more) of the heat from the circuit 820 (such as a power converter 520) disposed in cavity 120 is conveyed over the inductive paths to the heat sink 810, where respective heat is dissipated into the air or other media coupled to the heat sink 805.

Thus, most heat in the circuit 820 may be generated inside the power stages, which has to be dissipated to air or other media. In Artificial Intelligence and other high-current applications implementing the circuit 820, heat dissipation is achieved through the heat sink 810 or cold plate that is placed on the respective exposed surfaces 131-S and 132-S of the inductive paths.

In this example, thermal conductance of inductive paths (such as fabricated from a material such as copper) is 80 times that of magnetic permeable material 115 (i.e., magnetic core), so heat dissipation is more effective through the conductors.

Thus, the inductor device 110 may be disposed on the substrate 805 such as a circuit board. The inductor device 110 includes a cavity 120 disposed between the pair of terminals 121 and 123 and pair of terminals 122 and 124. The circuitry 820 (such as power supply circuitry 820 or power converter 520) is coupled to the circuit board (substrate 805) and resides in the cavity 120.

The circuit 820 may include a first power converter phase disposed on the circuit board; the first power converter phase controls first current through the first inductive path 131 to produce an output voltage to power the load 118. The circuit 820 (such as power converter 420 and corresponding components as previously discussed) may include a second power converter phase disposed on the substrate 805 such as circuit board; the first power converter phase and second power converter phase are disposed in parallel. The first power converter phase controls current through the inductive path 131 to the load 118; the second power converter phase controls current through the inductive path 132 to the load 118. Corresponding terminals 121, 122, 123, and 124 of the inductor device 110 are coupled directly to the substrate 805.

The heat sink 810 may be directly coupled to the portion of the first inductive path 131-S exposed on the second face 109-2. Additionally, the heat sink 810 may be directly coupled to the portion of the second inductive path 132-S exposed on the second face 109-2. The heat sink may include a layer of insulation to prevent electrical connectivity of the surface 131-S to the surface 132-S.

Again, exposing (surface 131-S and 132-S) of the magnetically coupled inductive paths 131 and 132 on the top of the inductor device 110 improves thermal heat transfer via the metal electrical conductors (inductive paths). As shown in FIG. 8, cooling through the inductive paths helps compensate increased power density of modules (such as including circuit 820) since direct cooling may not be available to cool the circuit 820.

Figure 8A:
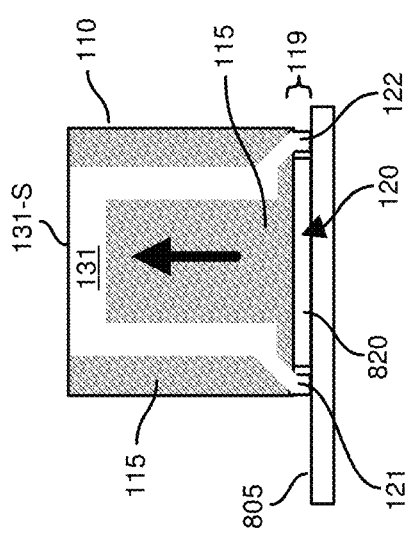
FIG. 8A is an example side view diagram of a first implementation of an inductor device as discussed herein.

FIG. 8A is an example side view diagram of a first implementation of an inductor device as discussed herein.

As shown in FIG. 8A, terminations (such as associated with terminals) may be extended beyond the core material to form "stand-offs" 119 and raising the magnetic core (magnetic permeable material 115) from the substrate 805 (such as PCB) to enable components placement beneath the coupled inductor device 110 in cavity 120.

Figure 8B:
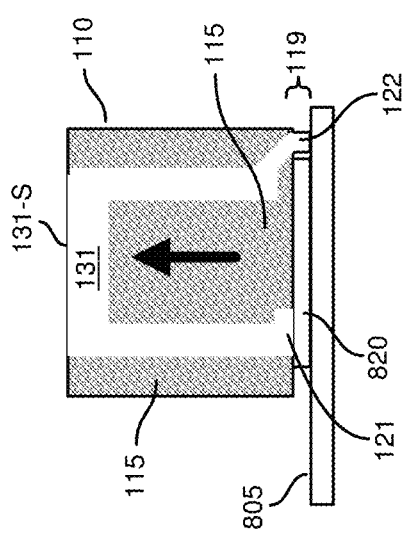
FIG. 8B is an example side view diagram of a second implementation of an inductor device as discussed herein.

FIG. 8B is an example side view diagram of a second implementation of an inductor device as discussed herein.

Bottom terminations (such as associated with terminals) can also be a combination of flush (121) and stand-offs (122) to enable soldering of the inductor device 110 to an underlying power device with the flush termination while the stand-off termination can soldered to the PCB. The terminal 121 provides connectivity of the inductive path 131 directly to the circuit 820, which is sandwiched between the inductor device 110 and the substrate 805.

Figure 8C:
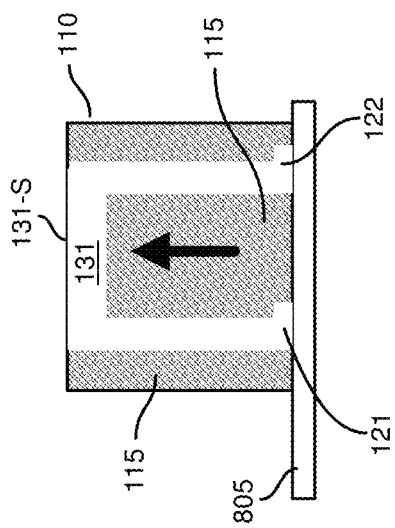
FIG. 8C is an example side view diagram of a third implementation of an inductor device as discussed herein.

FIG. 8C is an example side view diagram of a third implementation of an inductor device as discussed herein.

As shown in FIG. 8C, bottom side termination (such as terminals 121, 122, 123, and/or 124) of the inductive paths (a.k.a., conductors) may be bent flush to the bottom magnetic core for easy planar surface mounting of terminals 121, 122, 123, 124, etc., directly to the substrate 805.

FIG. 9 is an example diagram illustrating a top view of an inductor device as discussed herein.

As shown, more than two phases and corresponding inductive paths can be vertically merged into the inductor device 110. As seen in FIG. 9, a 3rd phase (inductive path 133 including surface 133-S) can be easily merged with coupling to the other phases of inductive paths 131 and 132. Note that coupling may not be uniform between all phases, such that coupling between adjacent neighbors will be higher than 2nd or 3rd neighbors. For example, the center conductor (inductive path 132) will couple into both left inductive path 133 and right neighbor inductive path 133 to further increase transient current capability. However, the leftmost conductor (inductive path 133) will only inversely couple with the center conductor (inductive path 132) and will weakly couple to the rightmost conductor (inductive path 131).

In FIG. 9A (showing a view of FIG. 9), a third inductive path 133 of the inductor device 110 is disposed adjacent the second inductive path 132. The third inductive path 133 extends from a fifth terminal 125 disposed on the first face 109-1 to a sixth terminal 126 disposed on the first face 109-1. A portion (surface 133-S) of the third inductive path 133 is exposed on and along the second face 109-2 of the inductor device 110. In a similar manner as previously discussed, the second face 109-2 provides dissipation of heat conveyed by the third inductive path 133 from the first face 109-1 to the second face 109-2 of the inductor device 110.

Figure 10:
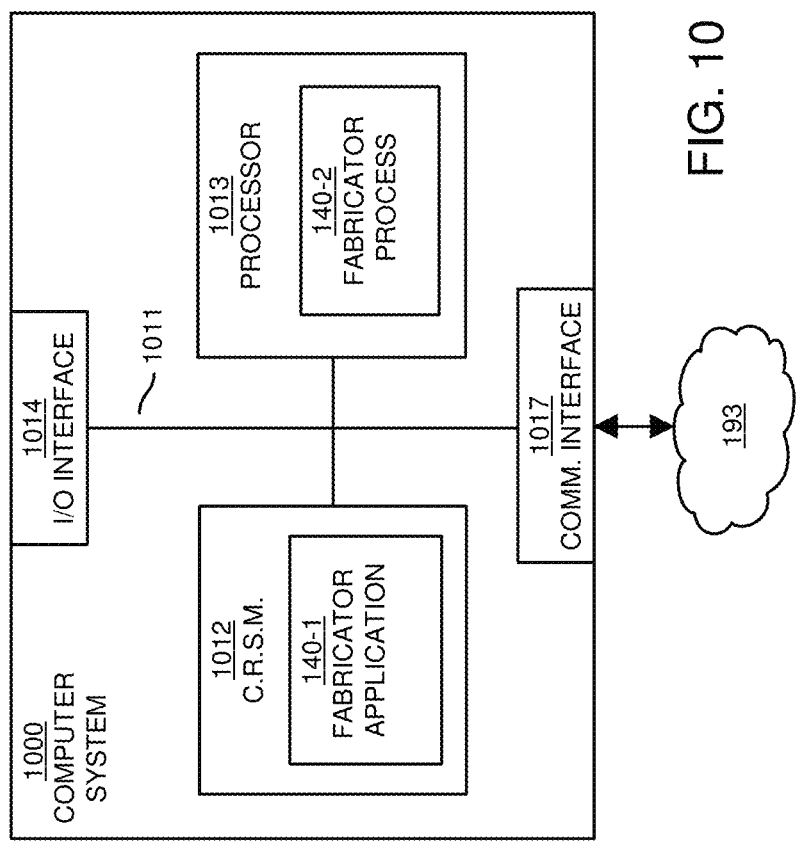
FIG. 10 is an example diagram illustrating example computer architecture (fabricator system, hardware, equipment, etc.) operable to execute one or more methods.

FIG. 10 is a diagram illustrating example computer architecture operable to execute one or more methods.

As previously discussed, any of the resources (such as controller, fabricator, manufacturing equipment, etc.) as discussed herein can be configured to include computer processor hardware and/or corresponding executable instructions to carry out the different operations as discussed herein.

As shown, computer system 1000 of the present example includes an interconnect 1011 that couples computer readable storage media (CRSM) 1212 such as a non-transitory type of media (which can be any suitable type of hardware storage medium in which digital information can be stored and retrieved), a processor 1013 (computer processor hardware), I/O interface 1014, and a communications interface 1017.

I/O interface(s) 1014 supports connectivity to external hardware 1099 such as a keyboard, display screen, repository, etc.

Computer readable storage medium 1012 can be any hardware storage device such as memory, optical storage, hard drive, floppy disk, etc. In one implementation, the computer readable storage medium 1012 stores instructions and/or data.

As shown, computer readable storage media 1012 can be encoded with fabricator application 140-1 (e.g., including instructions) to carry out any of the operations as discussed herein.

During operation, processor 1013 accesses computer readable storage media 1012 via the use of interconnect 1011 in order to launch, run, execute, interpret or otherwise perform the instructions in fabricator application 140-1 stored on computer readable storage medium 1012. Execution of the fabricator application 140-1 produces fabricator process 140-2 to carry out any of the operations and/or processes as discussed herein.

Those skilled in the art will understand that the computer system 1000 can include other processes and/or software and hardware components, such as an operating system that controls allocation and use of hardware resources to execute fabricator application 140-1.

In accordance with different implementations, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1050 may reside at any location or can be included in any suitable resource in any network environment to implement functionality as discussed herein.

Figure 11:
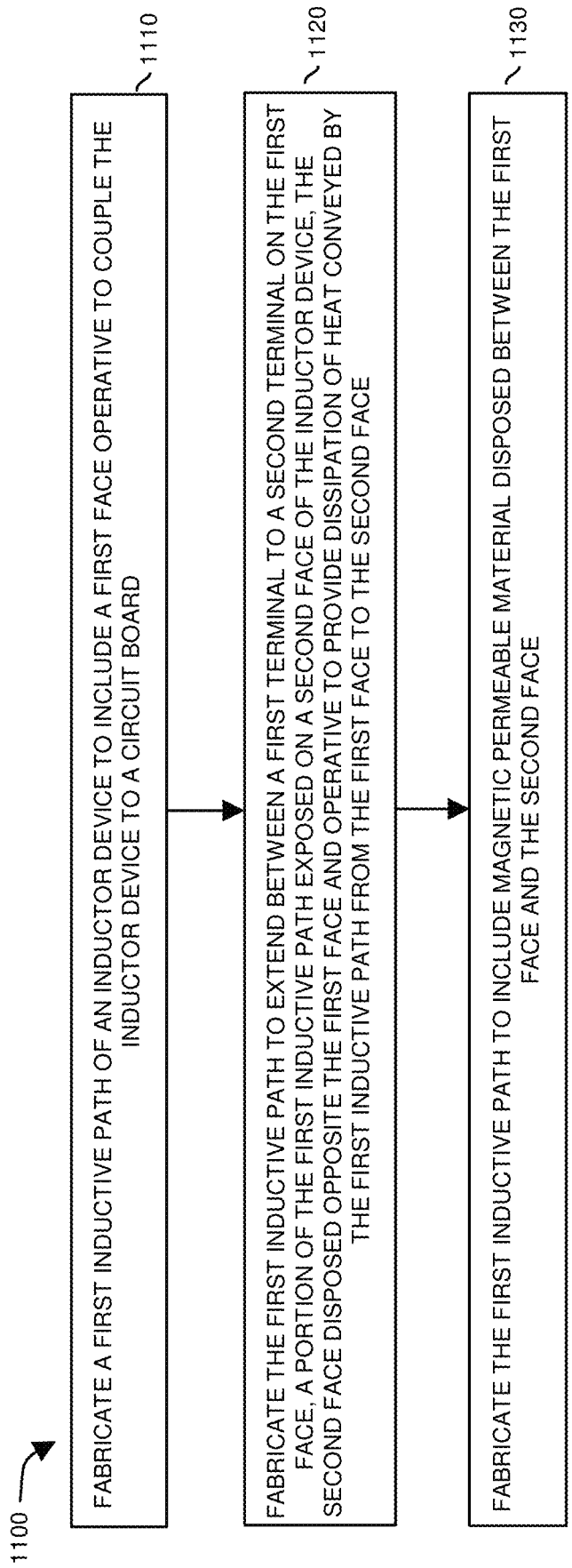
FIG. 11 is an example diagram illustrating a method of fabricating an inductor device.

Functionality supported by one or more resources as described herein are discussed via flowchart in FIG. 11. Note that the steps in the flowcharts below can be executed in any suitable order.

FIG. 11 is a flowchart 1100 illustrating an example method. Note that there will be some overlap with respect to concepts as discussed above.

In processing operation 1110, the fabricator (assembler) fabricates a first inductive path of an inductor device to include a first face operative to couple the inductor device to a circuit board.

In processing operation 1120, the fabricator (assembler) fabricate the first inductive path to extend between a first terminal to a second terminal on the first face, a portion of the first inductive path exposed on a second face of the inductor device, the second face disposed opposite the first face and operative to provide dissipation of heat conveyed by the first inductive path from the first face to the second face.

In processing operation 1130, the fabricator (assembler) fabricate the first inductive path to include magnetic permeable material disposed between the first face and the second face.

Note again that techniques herein are well suited for use in inductor and power converter applications. However, it should be noted that implementations herein are not limited to use in such applications and that the techniques discussed herein are well suited for other applications as well.

While this invention has been particularly shown and described with references to preferred implementations thereof, it will be understood by those skilled in the art that various changes in form and details may be made therein without departing from the spirit and scope of the present application as defined by the appended claims. Such variations are intended to be covered by the scope of this present application. As such, the foregoing description of implementations of the present application is not intended to be limiting. Rather, any limitations to the invention are presented in the following claims.

The invention claimed is:

1. An inductor device comprising:
 a first face operative to couple the inductor device to a circuit board;
 a first inductive path extending between a first terminal on the first face to a second terminal on the first face, a portion of the first inductive path exposed on a second face of the inductor device, the second face disposed opposite the first face, the second face operative to provide dissipation of heat conveyed by the first inductive path from the first face to the second face;
 a second inductive path extending from a third terminal disposed on the first face to a fourth terminal disposed on the first face, a portion of the second inductive path exposed on the second face of the inductor device, the second face operative to provide dissipation of heat conveyed by the second inductive path from the first face to the second face of the inductor device; and
 magnetic permeable material disposed between the first face and the second face, the magnetic permeable material operative to carry magnetic flux associated with the first inductive path and the second inductive path, the magnetic permeable material further operative to provide magnetic coupling between the first inductive path and the second inductive path.

2. The inductor device as in claim 1, wherein the first terminal and the second terminal on the first face are surface mount pads operative to affix the inductor device to the circuit board; and
 wherein the third terminal and the fourth terminal on the first face are surface mount pads operative to affix the inductor device to the circuit board.

3. A system comprising:
 the inductor device of claim 1 disposed on the circuit board;
 a first power converter phase disposed on the circuit board, the first power converter phase operative to control first current through the first inductive path to produce an output voltage to power a load; and
 a second power converter phase disposed on the circuit board in parallel with the first power converter, the second power converter phase operative to control second current through the second inductive path to produce the output voltage to power the load.

4. The inductor device of claim 1, wherein the magnetic permeable material is absent above the second face.

5. The inductor device of claim 1, wherein the first inductive path is U-shaped; and
wherein the second inductive path is U-shaped.

6. The inductor device as in claim 1, wherein the first inductive path and the second inductive path are disposed in parallel.

7. The inductor device as in claim 1, wherein the portion of the first inductive path exposed on the second face of the inductor device is a first segment of the first inductive path:
wherein the first inductive path further includes a second segment and a third segment;
wherein the second segment of the first inductive path extends between the first terminal and a first end of the first segment, the second segment operative to convey heat from the first face to the second face; and
wherein the third segment is disposed between the second terminal and a second end of the first segment, the third segment operative to convey heat from the first face to the second face.

8. The inductor device as in claim 1, wherein the portion of the first inductive path is a first portion of the first inductive path;
wherein the portion of the second inductive path is a first portion of the second inductive path;
the inductor device further comprising:
a first void in the magnetic permeable material, the first void disposed between a second portion of the first inductive path and a second portion of the second inductive path; and
a second void in the magnetic permeable material, the second void disposed between a third portion of the first inductive path and a third portion of the second inductive path.

9. The inductor device as in claim 8 further comprising:
a first continuum of magnetic permeable material to contain first magnetic flux, the first continuum of magnetic permeable material surrounding a combination of: i) the second portion of the first inductive path, ii) the second portion of the second inductive path, and iii) the first void; and
a second continuum of magnetic permeable material to contain second magnetic flux, the second continuum of magnetic permeable material surrounding a combination of: i) the third portion of the first inductive path, ii) the third portion of the second inductive path, and iii) the second void.

10. The inductor device as in claim 1, wherein the portion of the first inductive path is a first portion of the first inductive path:
wherein the portion of the second inductive path is a first portion of the second inductive path, the inductor device further comprising:
one or more first voids in the magnetic permeable material preventing formation of a first continuum of magnetic permeable material surrounding a combination of: i) a second portion of the first inductive path, and ii) a second portion of the second inductive path; and
one or more second voids in the magnetic permeable material preventing formation of a second continuum of magnetic permeable material surrounding a combination of: i) a third portion of the first inductive path, and ii) a third portion of the second inductive path.

11. The inductor device as in claim 1 further comprising:
a heat sink directly coupled to: i) the portion of the first inductive path exposed on the second face, and ii) the portion of the second inductive path exposed on the second face.

12. A circuit assembly comprising:
power supply circuitry;
the inductor device and the circuit board of claim 1; and
wherein the inductor device includes a cavity disposed between the first terminal and the second terminal, the power supply circuitry coupled to the circuit board and residing in the cavity.

13. A circuit assembly comprising:
electronic circuitry;
the inductor device and the circuit board of claim 1;
wherein the electronic circuitry is affixed to the circuit board;
wherein the first terminal of the inductor device is directly connected to a first contact element, the first contact element disposed on the electronic circuitry; and
wherein the second terminal of the inductor device is directly connected to a second contact element, the second contact element disposed on the circuit board.

14. The inductor device as in claim 1, wherein the portion of the first inductive path is a first portion; and
wherein a width of the first portion of the first inductive path exposed on the second face of the inductor device is greater than a width of a second portion of the first inductive path extending from the first face to the second face.

15. The inductor device as in claim 1, further comprising:
a third inductive path disposed adjacent the second inductive path, the third inductive path extending from a fifth terminal disposed on the first face to a sixth terminal disposed on the first face, a portion of the third inductive path exposed on the second face of the inductor device, the second face providing dissipation of heat conveyed by the third inductive path from the first face to the second face of the inductor device.

16. The inductor device as in claim 1, wherein the inductor device is a transformer assembly; and
wherein the first inductive path is a first winding and the second inductive path is a second winding.

17. The inductor device as in claim 1, wherein the inductor device includes a cavity in the magnetic permeable material, the cavity disposed on the first face between the first terminal and the second terminal.

18. The inductor device as in claim 1, wherein the portion of the first inductive path exposed on the second face of the inductor device is a first portion of the first inductive path;
wherein the portion of the second inductive path exposed on the second face of the inductor device is a first portion of the second inductive path; and
wherein the inductor device includes a cavity in the magnetic permeable material disposed on the first face between: i) a second portion of the first inductive path and a third portion of the first inductive path, and ii) a second portion of the second inductive path and a third portion of the second inductive path.

19. The inductor device as in claim 1, wherein the portion of the first inductive path is a first portion of the first inductive path;
wherein the portion of the second inductive path is a first portion of the second inductive path;
wherein a second portion of the first inductive path extends between the first terminal and the first portion of the first inductive path;
wherein a third portion of the first inductive path extends between the second terminal and the first portion of the first inductive path;

wherein a second portion of the second inductive path extends between the third terminal and the first portion of the second inductive path; and wherein a third portion of the second inductive path extends between the fourth terminal and the first portion of the first inductive path.

20. The inductor device as in claim 19 further comprising:
a first void in the magnetic permeable material between the second portion of the first inductive path and the second portion of the second inductive path; and
a second void in the magnetic permeable material between the third portion of the first inductive path and the third portion of the second inductive path.

21. The inductor device as in claim 20 further comprising:
a third void in the magnetic permeable material;
a fourth void in the magnetic permeable material;
a fifth void in the magnetic permeable material;
a sixth void in the magnetic permeable material;
wherein a combination of the first void in the magnetic permeable material, the second portion of the first inductive path, and the second portion of the second inductive path are disposed between the third void and the fourth void; and
wherein a combination of the second void in the magnetic permeable material, the third portion of the first inductive path, and the third portion of the second inductive path are disposed between the fifth void and the six void.

22. The inductor device as in claim 21, wherein the magnetic permeable material includes a first section, a second section, and a third section;
wherein the first section of the magnetic permeable material is spaced apart from the second section of the magnetic permeable material via the first void, the third void, and the fourth void; and
wherein the third section of the magnetic permeable material is spaced apart from the second section of the magnetic permeable material via the second void, the fifth void, and the sixth void.

23. The inductor device as in claim 22, wherein a first spacing between the first section of magnetic permeable material and the second section of magnetic permeable material provided by the first void is different than a second spacing between the first section of magnetic permeable material the second section of magnetic permeable material provided by the third void.

24. The inductor device as in claim 1, wherein the magnetic permeable material includes a first section, a second section, and a third section;
wherein the first section of the magnetic permeable material is spaced apart from the second section of the magnetic permeable material via a first void in the magnetic permeable material; and
wherein the third section of the magnetic permeable material is spaced apart from the second section of the magnetic permeable material via a second void in the magnetic permeable material.

25. The inductor device as in claim 1, wherein the portion of the first inductive path is a first portion of the first inductive path;
wherein the portion of the second inductive path is a first portion of the second inductive path;
wherein a second portion of the first inductive path extends between the first terminal and the first portion of the first inductive path;

wherein a third portion of the first inductive path extends between the second terminal and the first portion of the first inductive path;
wherein a second portion of the second inductive path extends between the third terminal and the first portion of the second inductive path;
wherein a third portion of the second inductive path extends between the fourth terminal and the first portion of the second inductive path;
a first gap in the magnetic permeable material, the first gap disposed between the second portion of the first inductive path and the second portion of the second inductive path, the first gap separating a first section of the magnetic permeable material and a second section of the magnetic permeable material; and
a second gap in the magnetic permeable material, the second gap disposed between the third portion of the first inductive path and the third portion of the second inductive path, the second gap separating the second section of the magnetic permeable material and a third section of the magnetic permeable material.

26. A method comprising:
fabricating an inductor device to include a first face, the first face operative to couple the inductor device to a circuit board;
fabricating a first inductive path of the inductor device to extend between a first terminal on the first face to a second terminal on the first face, a portion of the first inductive path exposed on a second face of the inductor device, the second face disposed opposite the first face and operative to provide dissipation of heat conveyed by the first inductive path from the first face to the second face; and
fabricating the inductor device to include a second inductive path; and
fabricating the first inductive path to include magnetic permeable material disposed between the first face and the second face, the magnetic permeable material magnetically coupling the first inductive path and the second inductive path.

27. An inductor device comprising:
a first face operative to couple the inductor device to a circuit board;
a first inductive path extending between a first terminal on the first face to a second terminal on the first face;
a second inductive path extending between a third terminal on the first face to a fourth terminal on the first face, the second inductive path magnetically coupled to the first inductive path via magnetic permeable material disposed between the first face and the second face; and
at least one void in the magnetic permeable material, the at least one void disposed between the first inductive path and the second inductive path.

28. The inductor device as in claim 27, wherein the at least one void includes:
a first void in the magnetic permeable material, the first void disposed between a first portion of the first inductive path and a first portion of the second inductive path; and
a second void in the magnetic permeable material, the second void disposed between a second portion of the first inductive path and a second portion of the second inductive path.

29. The inductor device as in claim 27, wherein the at least one void in the magnetic permeable material includes:
one or more first voids in the magnetic permeable material interrupting a continuum of magnetic permeable material surrounding a combination of: i) the first inductive path, and ii) the second inductive path.

\* \* \* \* \*